(12) United States Patent
Datta et al.

(10) Patent No.: US 7,170,120 B2
(45) Date of Patent: Jan. 30, 2007

(54) CARBON NANOTUBE ENERGY WELL (CNEW) FIELD EFFECT TRANSISTOR

(75) Inventors: Suman Datta, Beaverton, OR (US); Marko Radosavljevic, Beaverton, OR (US); Brian Doyle, Portland, OR (US); Jack Kavalieros, Portland, OR (US); Justin Brask, Portland, OR (US); Amlan Majumdar, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/096,984

(22) Filed: Mar. 31, 2005

(65) Prior Publication Data

US 2006/0220074 A1 Oct. 5, 2006

(51) Int. Cl.
*H01L 29/76* (2006.01)
(52) U.S. Cl. ............................... 257/288; 257/E51.038
(58) Field of Classification Search ................ 257/288, 257/E51.038
See application file for complete search history.

(56) References Cited

U.S. PATENT DOCUMENTS

| | | |
|---|---|---|
| 6,869,889 B1 | 3/2005 | Brask et al. |
| 2004/0120880 A1 | 6/2004 | Zhang et al. |
| 2005/0147373 A1 | 7/2005 | Zhang et al. |
| 2005/0218372 A1 | 10/2005 | Brask et al. |
| 2006/0063318 A1 | 3/2006 | Datta et al. |
| 2006/0070920 A1 | 4/2006 | Zhang et al. |
| 2006/0141634 A1 | 6/2006 | Zhang et al. |

OTHER PUBLICATIONS

Jeroen W. G. Wilder, et al., "Electronic Structure of Atomically Resolved Carbon Nanotubes", Letters to Nature, Jan. 1, 1998, 5 pages, http://www.nature.com/cgi-taf/DynaPage.taf?file=/nature/journal/v391/n6662/full/39105a...
Ming Zheng, et al., "Structure-Based Carbon Nanotube Sorting by Sequence-Dependent DNA Assembly", SCIENCE, vol. 302, Nov. 28, 2003, pp. 1545-1548.
Ming Zheng, et al., "DNA-Assisted Dispersion and Separation of Carbon Nanotubes", Nature Publishing Group 2003, Nature Materials, vol. 2, May 2003, pp. 338-342.
H. Kataura, et al., "Optical Properties of Single-Wall Carbon Nanotubes", Synthetic Metals 103, 1999, pp. 2555-2558.
Yang Zhao, et al., "Absorption-Spectral Features of Single-Walled Carbon Nanotubes", Chemical Physics Letters, Department of Chemistry,University of Hong Kong, Pokfulam Road, Hong Kong, PR China, Feb. 4, 2004, pp. 149-154.

(Continued)

*Primary Examiner*—Nathan J. Flynn
*Assistant Examiner*—Tan Tran
(74) *Attorney, Agent, or Firm*—Blakely, Sokoloff, Taylor & Zafman LLP

(57) ABSTRACT

A structure to form an energy well within a Carbon nanotube is described. The structure includes a doped semiconductor region and an undoped semiconductor region. The Carbon nanotube is between the doped semiconductor region and the undoped semiconductor region. The structure also includes a delta doped semiconductor region. The undoped semiconductor region is between the Carbon nanotube and the delta doped region. The delta doped semiconductor region is doped opposite that of the doped semiconductor region.

15 Claims, 11 Drawing Sheets

OTHER PUBLICATIONS

W. Orellana et al., "First-Principles of Carbon Nanotubes Adsorbed on Si(001)", Physical Review Letters, vol. 91, No. 16, Oct. 17, 2003, 4 pages.

Jia Chen, et al., "Self-aligned Carbon Nanotube Transistors with Novel Chemical Doping", IBM T.J. Watson Research Center, Yorktow Heights, NY 10598, 2004 IEEE, 4.

S. J. Wind, et al., "Lateral Scaling in Carbon-Nanotube Field-Effect Transistors", Physical Review Letters, vol. 91, No. 5, Aug. 1, 2003, 4 pages.

S. M. Sze, "Physics of Semiconductor Devices", Second Edition, a Wiley-Interscience Publication, Chapter 8, Section 8.2.1, May 1981, pp. 434-438.

J. E. Collins, et al., "Optical Switching of Single-Wall Carbon Nanotube Aborption Through Field Gating", 9 pages, 2001.

CARBON NANOTUBE ENERGY WELL (CNEW) FIELD EFFECT TRANSISTOR

FIELD OF INVENTION

The field of invention relates generally to the electronic arts; and, more specifically, to a Carbon Nanotube Energy Well (CNEW) Field Effect Transistor.

BACKGROUND

FIG. 1a shows a simple model for a field effect transistor (FET) 100. An FET typically has three terminals 101, 102, 103 and is typically viewed as having two basic modes of operation: "linear"; and, "saturation". Both the linear and velocity saturation regions are observed in the exemplary FET transfer characteristics that are presented in FIG. 1b.

According to a perspective of an FET's linear and saturation regions of operation, the first terminal 101 is used to influence the number of free carriers that are present within a conductive channel 104. The current through the conductive channel 104 is approximately proportional to the number of these free carriers multiplied by their effective velocity through the conductive channel 104.

Over the course of the FET's "linear" region of operation, which is approximately region 105 of FIG. 1b, a voltage established across the second and third terminals 102, 103 ($V_{23}$) determines the current that flows through the conductive channel ($I_{23}$). By contrast, over the course of the FET's "saturation" region of operation, which is approximately region 106 of FIG. 1b, the current $I_{23}$ that flows through the conductive channel 104 is essentially "fixed" because the conductive channel's ability to transport electrical current is "saturated" (e.g., the velocity of the conductive channel's free carriers reach an internal "speed limit"). Traditionally, one of terminals 102 and 103 is called a "source" and the other of terminals 102 and 103 is called a "drain".

Recent publications have disclosed FETs that employ a Carbon Nanotube (CNT) as the conductive channel 104. A Carbon nanotube (CNT) can be viewed as a sheet of graphite (also known as graphene) that has been rolled into the shape of a tube (end capped or non-end capped). CNTs having certain properties (e.g., a "metallic" CNT having electronic properties akin to a metal) may be appropriate for certain applications while CNTs having certain other properties (e.g., a "semiconducting" CNT having electronic properties akin to a semiconductor) may be appropriate for certain other applications. CNT properties tend to be a function of the CNT's "chirality" and diameter. The chirality of a CNT characterizes its arrangement of carbon atoms (e.g., arm chair, zigzag, helical/chiral). The diameter of a CNT is the span across a cross section of the tube.

FIG. 2a shows a basic outline for a transistor designed to use a CNT 204 as its conductive channel. According to the transistor design of FIG. 2a, a metal source electrode 202 makes contact to a CNT 204 at contact region 204a, and, a metal drain electrode 203 makes contact to CNT 204 at contact region 204b. The transistor also includes a gate electrode 201. In implementation, the CNT 204 is expected to have electrical conducting properties sufficient for the gate electrode 201 to be used as a basis for influencing the number of free carriers that appear in the CNT 204 so that the magnitude of the current that flows through the CNT can be modulated at the gate node 201.

However, a transistor designed according to the approach of FIG. 2a, due to an "ambipolar conduction" problem, will exhibit excessive current through the CNT conductive channel 204 when the transistor is supposed to be "off". FIG. 2b shows an energy band diagram across the length of the CNT 204 when a $V_{DS}$ voltage of reasonable magnitude is applied across the drain and source electrodes while the transistor is "off". When the transistor is off, ideally, no current flows through the CNT. However, the $V_{DS}$ voltage "thins" the Schottky barriers 210, 220 formed at contact regions 204a and 204b, respectively, so as to promote tunneling into the CNT. Specifically, for n type FETs, holes tunnel through the drain Schottky barrier 220. These carriers then traverse the length of the CNT conductive channel 204 resulting in current that is unacceptably high for an "off" transistor.

FIGURES

The present invention is illustrated by way of example, and not limitation, in the figures of the accompanying drawings in which like references indicate similar elements and in which.

DETAILED DESCRIPTION

A solution to the ambipolar current leakage problem in CNT based FETs is to create an energy barrier within the CNT, while the FET is "off", that substantially prevents the flow of free carriers through the CNT. As described in more detail below, such an energy barrier can be established by design through the placement of doped semiconductor source/drain contacts to the CNT conductive channel and the placement of the CNT upon a doped semiconductor substrate. This design effectively creates an energy well (e.g., a quantum well) within the CNT conductive channel. Carriers that contribute to the CNT's electrical current in the FET's "on" state are confined within the energy well. In the case of an "n type" FET device, free electrons fall to the bottom of a conduction band well, and, in the case of "p type" FET device, free holes rise to the top of a valence band well.

Through proper adjustment of the gate and source voltages relative to one another, in the case of n type devices, the bottom of the conduction band energy well can be positioned above or below the CNT's Fermi level; which, in turn, establishes stable "on" and "off"FET states. Importantly, during the "off" state, the bottom of the conduction band energy well is positioned above the CNT's Fermi level. As will be elaborated on at length in the following description, the positioning of the well bottom above the Fermi level in conjuction with the effect of the doped semiconductor contacts and substrate effectively forms an energy barrier within the CNT conductive channel that substantially impedes the flow of free carriers that have been injected into the CNT at its source and drain contact regions (e.g., due to a substantial drain-to-source voltage). In the case of p type FET devices a similar effect is implemented in the "off" state in which the top of a valence band well is positioned beneath the CNT's Fermi level so as to form a barrier against current flow caused by carriers injected in the CNT at its source and drain contact regions.

Figure 1A:
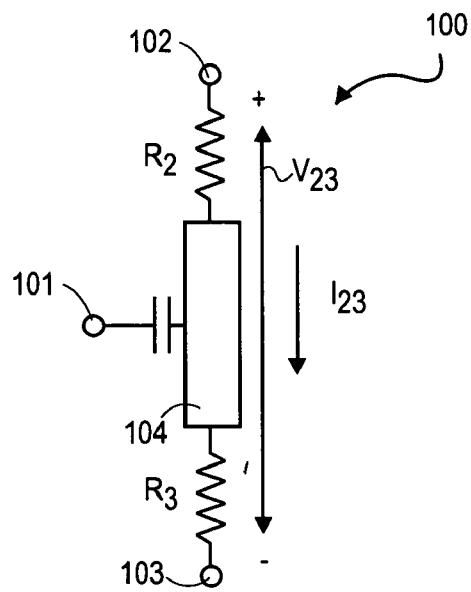
FIG. 1 (prior art) shows a model for an FET.
Figure 1B:
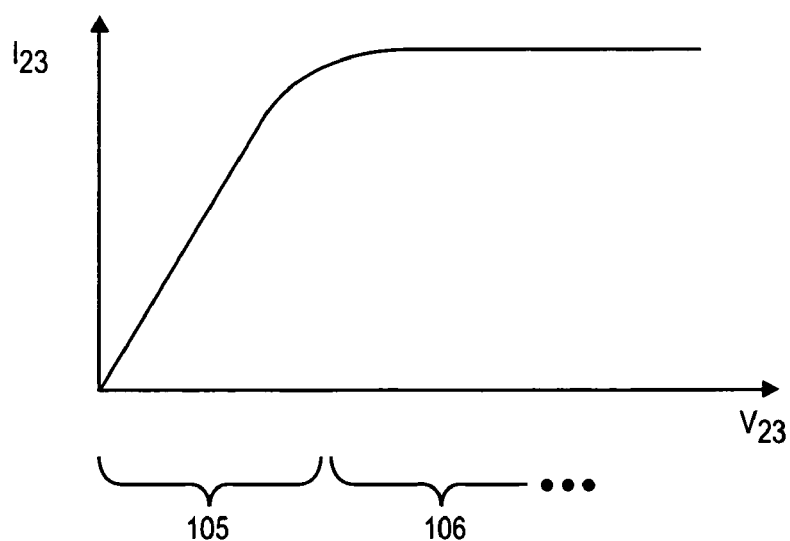
Figures 2A, 2B:
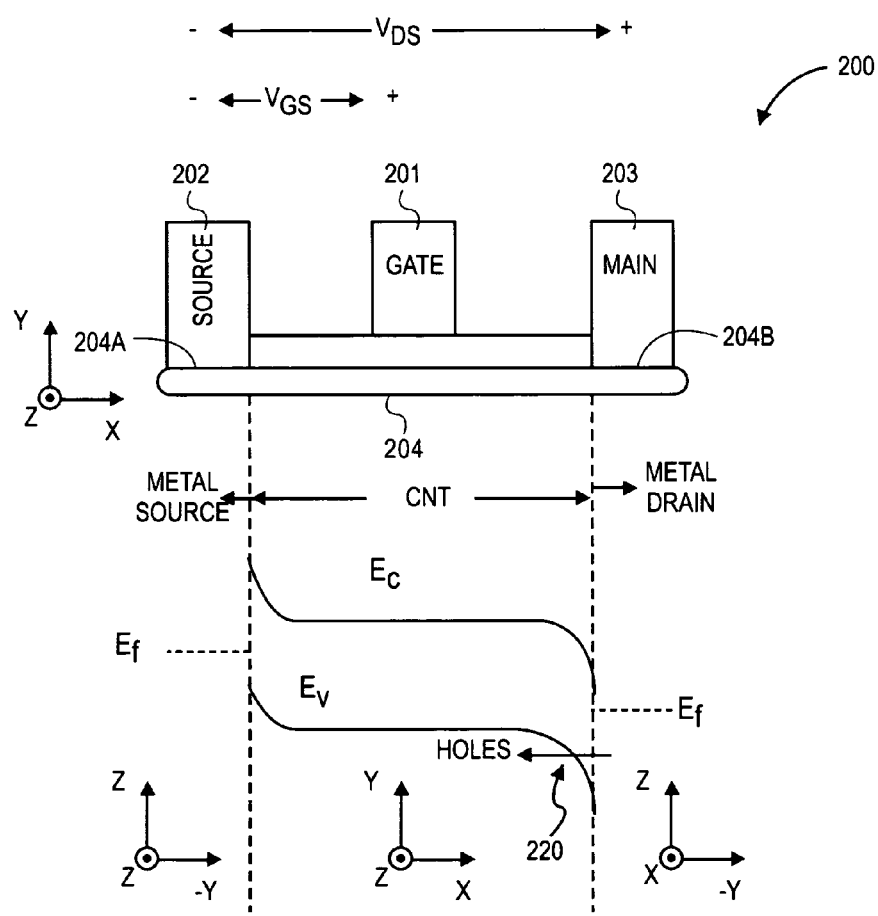
FIG. 2a (prior art) shows an FET having a CNT conductive channel.
FIG. 2b (prior art) shows an energy band diagram for the FET of FIG. 2a while the FET is in an "off" state.
Figure 3:
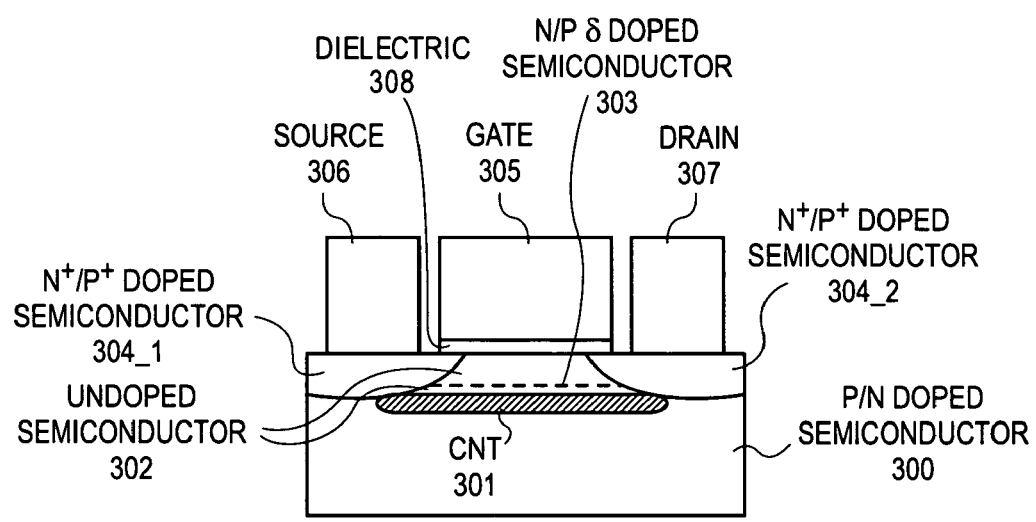
FIG. 3 shows a Carbon Nanotube Energy Well (CNEW) FET.

FIG. 3 shows an exemplary depiction of an FET that is designed in accordance with the teachings expressed just above. According to the design of the FET depicted in FIG. 3, a CNT 301 that is to be used as the FET's conductive channel is positioned on a semiconductor substrate 300 that has been doped p type or n type ("p/n"). The CNT 301 is largely surrounded by a layer of undoped semiconductor 302 having a narrow region 303 that has been "delta doped" n type or p type ("n/p"). From the perspective of FIG. 3, the embedding of the delta doped region 303 in undoped semiconductor region 302 effectively creates a first, "lower" undoped semiconductor region 302a, and, a second, "upper" undoped semiconductor region 302b. Here, the p/n vs. n/p nomenclature is meant to indicate that region 303 is doped "opposite" that of region 300. That is, if the substrate 300 is doped p type, the delta doped region 303 is doped n type; or, if the substrate 300 is doped n type, the delta doped region 303 is doped p type. Delta doping, as is known in the art, is the formation of a very narrow doped region.

Source and drain contacts to the CNT 301 are made with degenerately doped n+/p+ regions 304_1, 304_2. Here, again, the "n+/p+" nomenclature is used to indicate that regions 304_1, 304_2 are doped opposite that of region 300. Thus, if the delta doped region 303 has been doped n type, the CNT contact regions 304_1, 304_2 are degenerately doped n type (n+); or, if the delta doped region 303 has been doped p type, the CNT contact regions 304_1, 304_2 are degenerately doped p type (p+). Metal electrodes 306, 307 that respectively correspond to the FET's source and drain electrodes make contact to the degenerately doped regions 304_1, 304_2, respectively. Upon the undoped semicondcutor region 302 and above the delta doped region 303 is a layer of dielectric 308. A gate electrode 305 is formed over the dielectric region 308.

In an implementation the doped and undoped semiconductor layers 300, 302, 303, 304_1, 304_2 use Silicon (Si) as the base material. The dielectric layer 308 may be formed of one or more various "Hi-K" dielectric materials including $HfO_2$, $ZrO_2$, $TiO_2$, HfTiO, HfAlO, $La_2O_3$ and LaAlO.

The type of FET that is formed by the design observed in FIG. 3 may be referred to as a Carbon Nanotube Energy Well (CNEW) FET (because an energy well is purposely created within the CNT conductive channel). Various types of CNEW FETs can be constructed including "depletion mode n type", "depletion mode p type", "enhancement mode n type" and "enhancement mode p type".

Here, the term "depletion mode" means that free carriers exist in the CNT conductive channel in sufficient numbers to carry meaningful current through the CNT conductive channel when the gate-to-source voltage ($V_{GS}$) is approximately 0 volts. By contrast, the term "enhancement mode" means that free carriers do not exist in the CNT conductive channel in sufficient numbers to carry meaningful current through the CNT conductive channel when the $V_{GS}$ voltage is approximately 0 volts. In more simplistic terms, "depletion mode" means the FET is "on" if $V_{GS} \approx 0$ volts, and, "depletion mode" means the FET is "off" if $V_{GS} \approx 0$ volts. The term "n type" means that there are more free electrons than free holes that contribute to the CNT current. The term "p type" means that there are more free holes than free electrons that contribute to the CNT current.

Figure 4A:
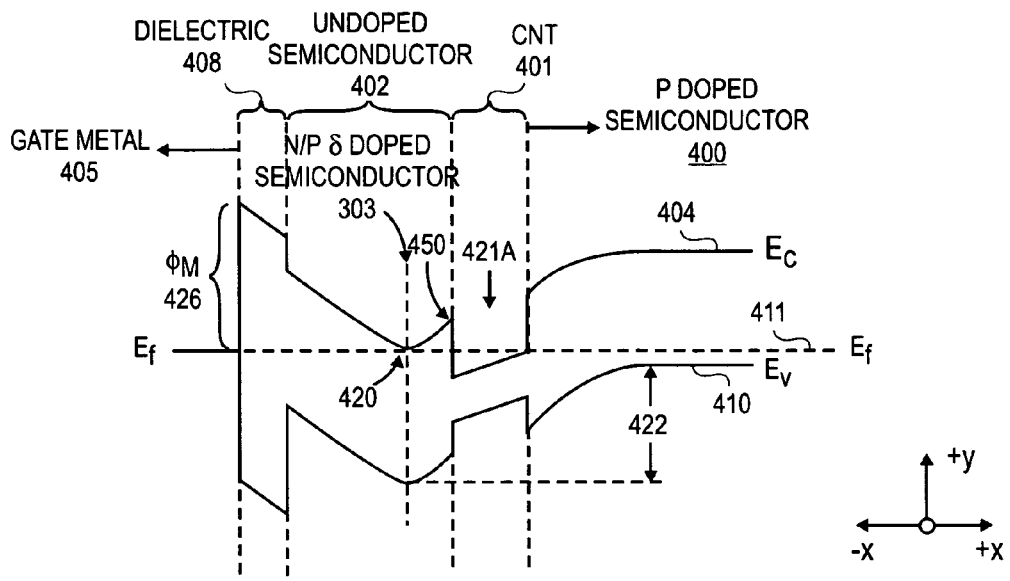
FIGS. 4a through 4d show energy band diagrams for a depletion mode n type CNEW FET.
Figure 4B:
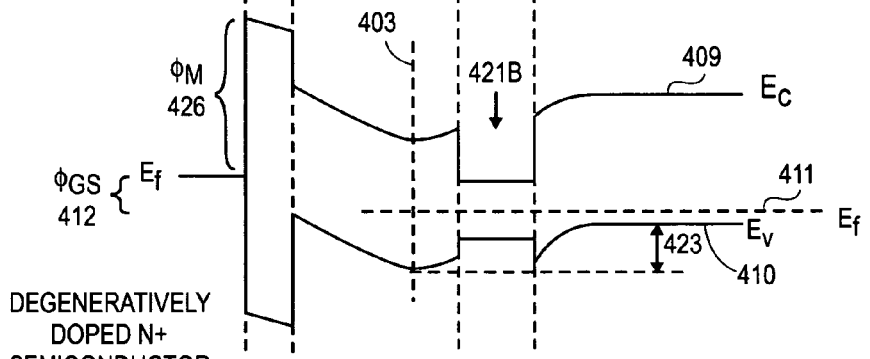
Figure 4C:
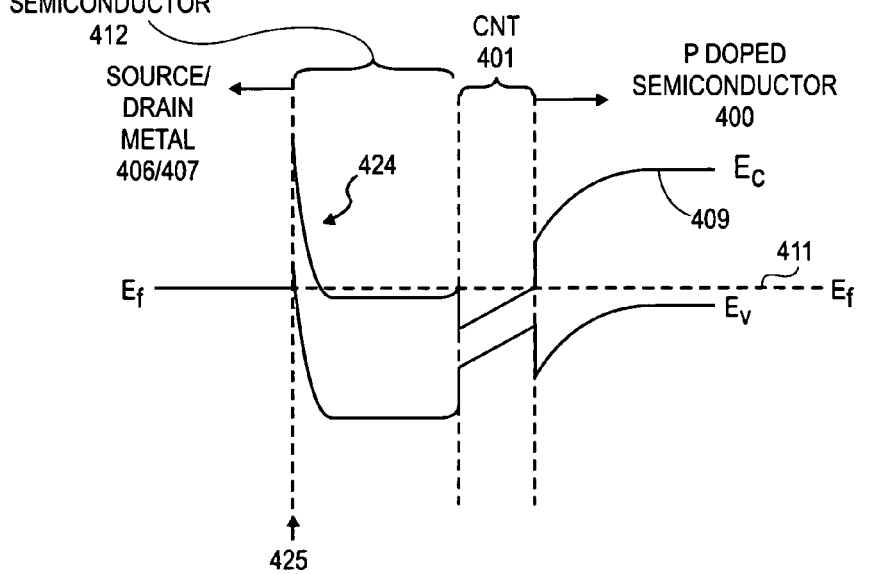
Figure 5A:
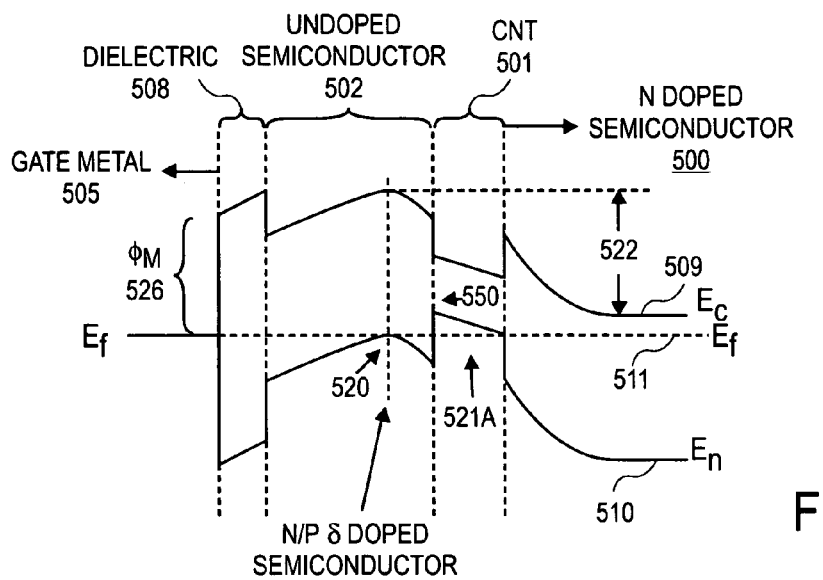
FIGS. 5a through 5d show energy band diagrams for a depletion mode p type CNEW FET.
Figure 5B:
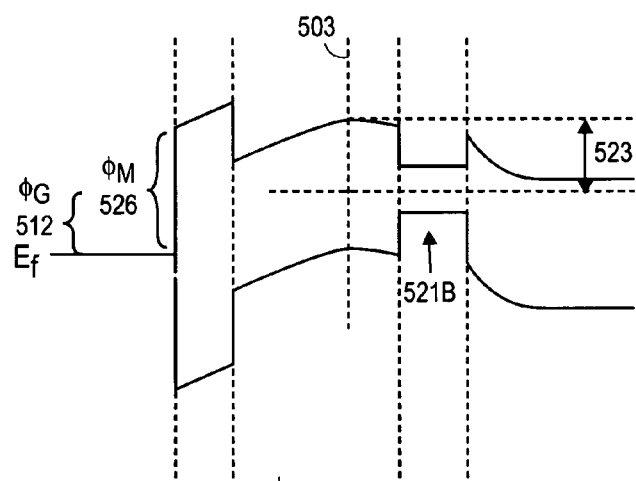
Figure 5C:
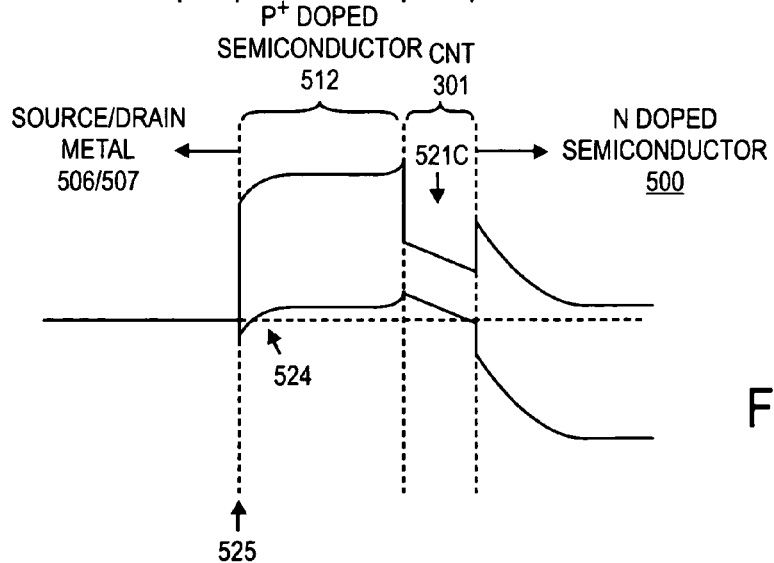
Figure 6A:
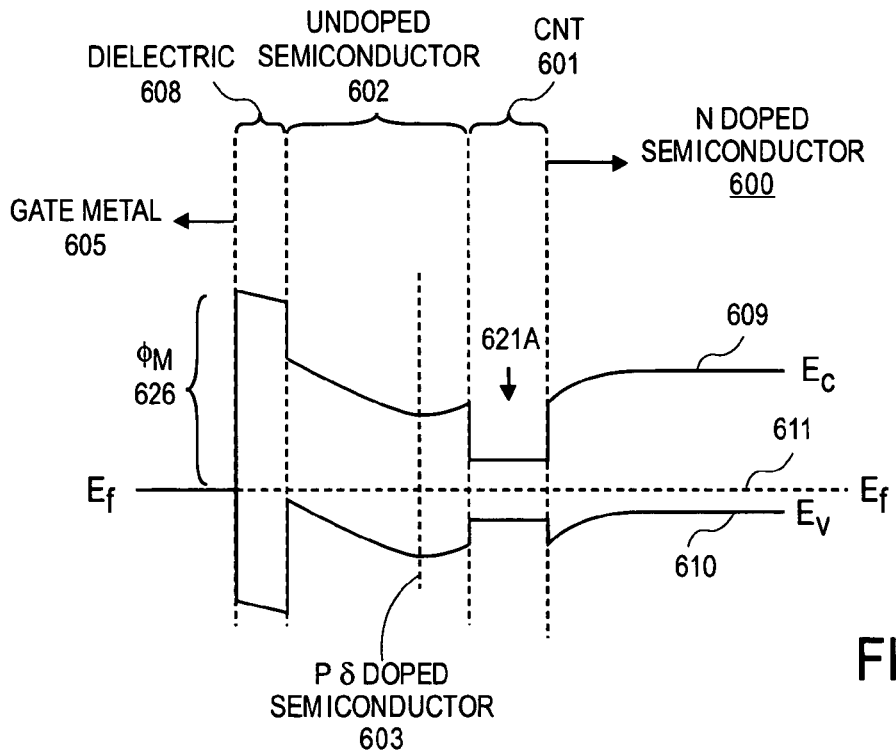
FIGS. 6a and 6b show energy band diagrams for an enhancement mode n type CNEW FET.
Figure 6B:
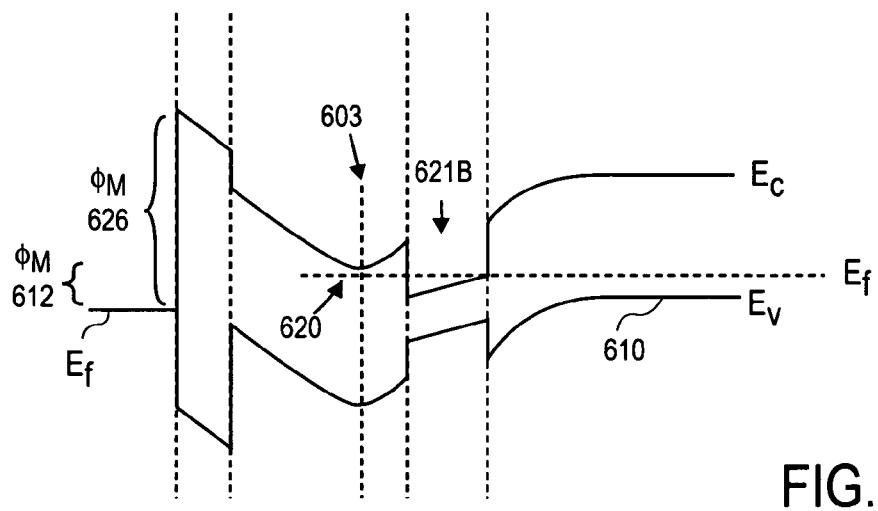
Figure 7A:
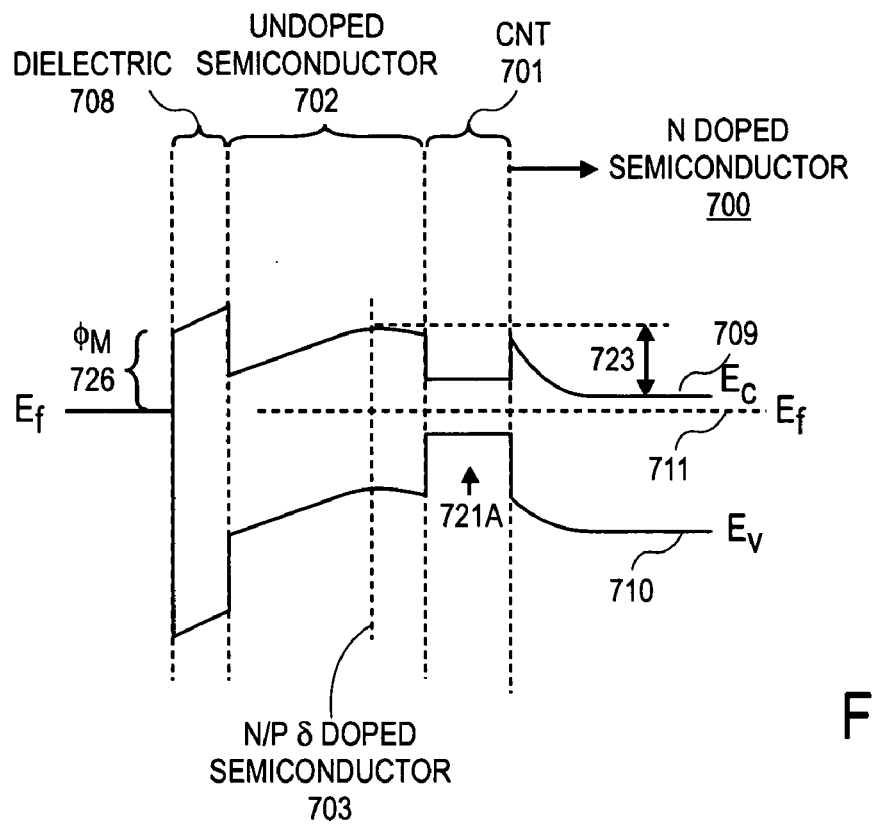
FIGS. 7a and 7b show energy band diagrams for an enhancement mode p type CNEW FET.
Figure 7B:
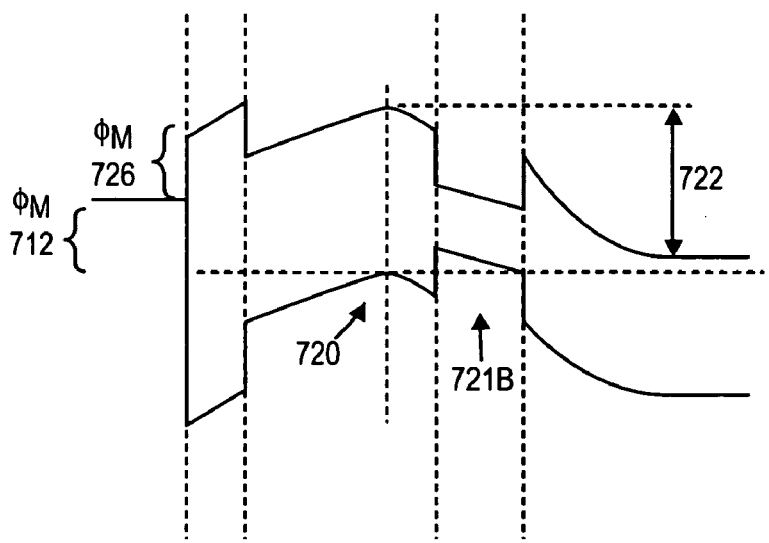

Over the course of the following discussion, FIGS. 4a through 4c demonstrate exemplary energy band diagrams for a "depletion mode n type" CNEW FET, FIGS. 5a through 5c demonstrate exemplary energy band diagrams for a "depletion mode p type" CNEW FET, FIGS. 6a through 6c demonstrate exemplary energy band diagrams for an "enhancement mode n type" CNEW FET, and, FIGS. 7a through 7c demonstrate exemplary energy band diagrams for an "enhancement mode p type" CNEW FET. Each of these device types are discussed in succession immediately below.

FIGS. 4a through 4d show pertinent electron energy band diagrams for a depletion mode n type CNEW FET. FIG. 4a shows an energy band diagram through the gate metal 405, the dielectric layer 408, the undoped 402 and delta doped 403 semiconductor layers, the CNT 401 and the doped semiconductor substrate layer 400. In the case of an n type device, notice that the delta doped region 403 is doped n type (i.e., with electron donors) and the doped substrate 400 is doped p type (i.e., with electron acceptors). The conduction band of the semiconductor regions 402, 403, 400 and CNT 401 is observed as energy band 409, the valence band of the semiconductor regions 402, 403, 400 and CNT 401 is observed as energy band 410, and the Fermi level is observed as energy level 411. In an implementation, the CNT 401 is a semiconducting, single walled CNT (i.e., a CNT whose Fermi level is naturally set between two conduction bands when the CNT is unbiased).

Depletion Mode N Type CNEW FET

FIG. 4a assumes a simple electrical configuration in which both the doped semiconductor substrate region 400 and source electrode are grounded. Here, because the Fermi level 411 is observed as being constant from the doped semiconductor substrate region 400 through the gate metal 405, the $V_{GS}$ voltage of the device is understood to be approximately 0 volts. From FIG. 4a, the natural conduction band 409 bending that arises for a CNT 401 placed between a nearby n type delta doped region 403 and p type substrate 400 when $V_{GS} \approx 0$ volts results in the formation of an energy well 421a whose bottom falls beneath the Fermi level 411.

Here, the n type delta doped region 403 effectively "pins" the conduction band 409 near to the CNT 401 at or near the Fermi level 411. Because the delta doped region 403 is positioned close to the interface between the CNT 401 and the undoped semiconductor layer 402, the pinning of the conduction band 409 by delta doped region 403 causes the CNT's conduction band to be pinned to a level 450 that is above but close to the Fermi level 411 at the CNT/undoped semiconductor interface. Owing to the smaller bandgap energy of the CNT as compared to the surrounding semiconductor regions 402, 400, the conduction band within the CNT 401 falls below the Fermi level 411 so as to form the energy well 421 with a bottom that resides beneath the Fermi level 411.

Simplistically speaking, most all electron energy states beneath the Fermi level 411 are filled with electrons, and, an energy well has electron energy states that are above the bottom of the well the energy and beneath the Fermi level. As such, at $V_{GS} \approx 0$, the energy well is said to be populated with free electrons that are able to effect electrical current flow within the CNT under application of a $V_{DS}$ voltage. Therefore the FET is "on" when $V_{GS} \approx 0$.

The presence of the delta doped region/layer 403 in the undoped semiconducting region 402 effectively produces a thin but heavy concentration of electrons that are attracted to and recombine with holes associated with the p doped semiconductor region 400. Hence, a built-in voltage similar to those formed with traditional pn juctions is formed whose electric fields cross through the CNT 401. Energy barrier 422 corresponds to this built-in voltage which, in the steady state, prevents the flow of majority carrier holes from the p doped semiconductor region 400 to the dielectric 408/ undoped semiconductor region 402 interface.

FIG. 4b shows the same structure of FIG. 4a but at a different $V_{GS}$ voltage. Specifically, the $V_{GS}$ voltage is set to a voltage of $\phi_{GS}/q_e$—whose corresponding energy is represented as energy span $\phi_{GS}$ 412 in FIG. 4b. Noting that $q_e$ is the charge of an electron, which is a negative quantity, the applied $V_{GS}$ voltage is therefore less than 0 volts (because the Fermi level within the gate metal 405 of FIG. 4b is "higher" than the Fermi level within the gate metal 405 of FIG. 4a).

According to the energy band diagram of FIG. 4b, the negative $V_{GS}$ voltage is sufficiently high to "pull" the bottom of the well 421b above the Fermi level 411. With the bottom of the well being above the Fermi level 411, the electron energy states within the well 421b will be substantially empty. With the well 421b substantially empty of free electrons, as a basic perspective, the CNT 401 can be viewed as being in a non-conductive state (i.e., the FET is "off").

By setting the $V_{GS}$ voltage to a level that sets the Fermi level midway between the conduction band 409 and valence band 410, the CNT 401 will be in an optimally devoid state of both free electrons and free holes. Thus, applied $V_{GS}$ voltages at or near this level can be viewed as a threshold voltage that turns the FET off. In reaching the steady state of FIG. 4b, the negative gate voltage repels electrons from the delta doped region 403 and CNT 401 into the p doped substrate region 400, and, attracts holes from the p doped semiconductor region 400 into the CNT 401 and delta doped region 403. As such, the built in voltage that spans through the CNT (which is represented by barrier energy 423 of FIG. 4b) is lowered in comparison to the built-in voltage of FIG. 4a.

FIG. 4c shows an energy band diagram for a different portion of the FET than those depicted in FIGS. 4a and 4b. Specifically, whereas FIGS. 4a and 4b show energy diagrams for the device structure beneath the gate metal, FIG. 4c shows a depiction of an energy band diagram for the device structure beneath the source or drain contact regions. Thus instead of a metal/dielectric/undoped semiconductor regions leading up to the CNT 401 (as observed in FIGS. 4a and 4b), FIG. 4c shows a source or drain electrode metal region 406/407 and a degeneratively doped (n+) semiconductor region 412 leading up the CNT 401.

With the n+ semiconductor region 412 being in contact with the CNT 401, the conduction band 409 at the n+/CNT interface is effectively pinned at or near the Fermi level 411. As such, the bottom of the well is positioned beneath the Fermi level 411 causing the CNT to be populated with electrons beneath the source/drain regions. Depending on the applied $V_{DS}$ voltage, but at least over a range of reasonable $V_{DS}$ voltages, the top of the energy well is apt to be beneath the Fermi level 411 even if the FET is "off".

Figure 4D:
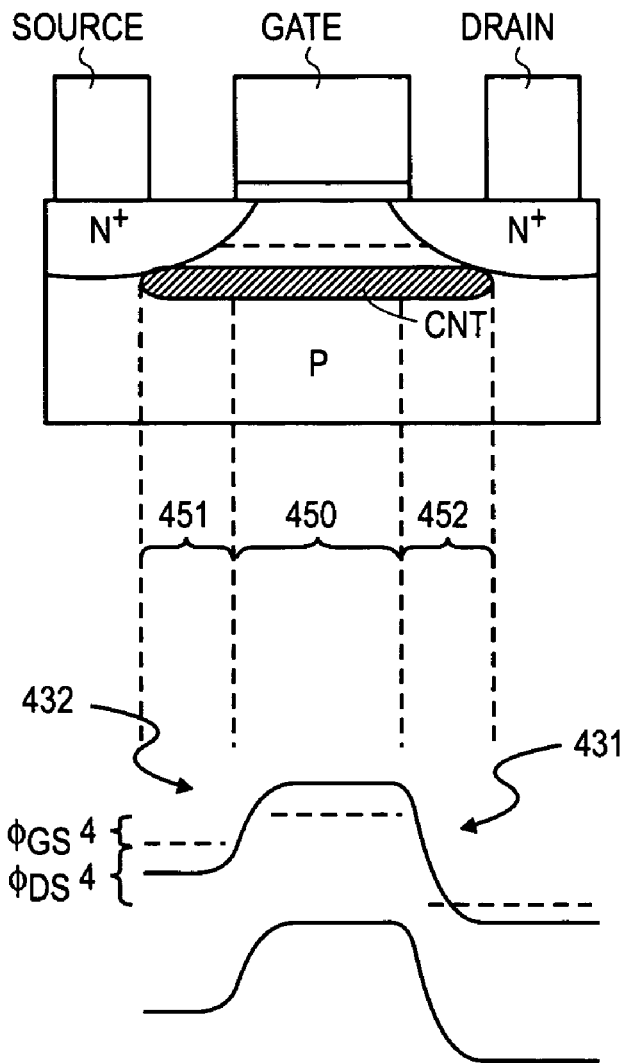

However, as depicted in FIG. 4d, the condition of having free carriers in the CNT 401 even though the FET is "off" does not lead to the flow electrical current because of the existence of energy barriers 431, 432. The energy diagram of FIG. 4c shows the conduction and valence band bending that occurs over the length of the CNT when the FET is "off". Here, as described above with respect to FIG. 4b, the bottom of the well (more specifically, the CNT conduction band) rises above the Fermi level for the CNT regions beneath the gate (i.e., approximately over region 450 of FIG. 4d); and, as described above with respect to FIG. 4c, the bottom of the well falls below the Fermi level beneath the source and drain region (approximately over regions 451 and 452 of FIG. 4d).

The existence of the energy band conditions in the regions described just above creates energy barriers 431 and 432 which act to prevent the flow of electrons from the CNT's source or drain regions into the region of the CNT that resides beneath the gate. As such, current flow is practically non-existent within the CNT even though it contains free electrons at its source and drain regions. Here, energy differences $\phi_{GS}$ 433 and $\phi_{DS}$ 434 correspond to the applied $V_{GS}$ and $V_{DS}$ voltages respectively. Note that the $V_{GS}$ voltage is negative and the $V_{DS}$ voltage is positive.

Depletion Mode P Type CNEW FET

FIGS. 5a through 5d show pertinent electron energy band diagrams for a depletion mode n type CNEW FET. FIGS. 5a through 5d (like FIGS. 4a through 4d) assume a simple electrical configuration in which both the doped semiconductor substrate region 500 and source electrode are grounded. From FIG. 5a, the natural conduction band 509 bending that arises for a CNT 501 placed between a nearby p type delta doped region 503 and p type substrate 500 when $V_{GS} \approx 0$ volts results in the formation of an energy well 421a whose top rises above the Fermi level 511.

Here, the p type delta doped region 503 effectively "pins" the valence band 510 near to the CNT 501 at or near the Fermi level 511. Because the delta doped region 503 is positioned close to the interface between the CNT 501 and the undoped semiconductor layer 502, the pinning of the valence band 510 by delta doped region 503 causes the CNT's valence band to be pinned to a level 550 that is beneath but close to the Fermi level 511 at the CNT/undoped semiconductor interface. Owing to the smaller bandgap energy of the CNT as compared to the surrounding semiconductor regions 502, 500, the conduction band within the CNT 501 falls below the Fermi level 511 so as to form the energy well 521 with a top that resides above the Fermi level 411. As such, at $V_{GS} \approx 0$, the energy well is said to be populated with free holes that are able to effect electrical current flow within the CNT under application of a $V_{DS}$ voltage. Therefore the FET is "on" when $V_{GS} \approx 0$.

The presence of the delta doped region/layer 503 in the undoped semiconducting region 502 effectively produces a thin but heavy concentration of holes that are attracted to and recombine with electrons associated with the n doped semiconductor region 500. Hence, a built-in voltage similar to those formed with traditional pn juctions is formed whose electric fields cross through the CNT 501. Energy barrier 522 corresponds to this built-in voltage which, in the steady state, prevents the flow of majority carrier electrons from the n doped semiconductor region 500 to the dielectric 508/ undoped semiconductor region 502 interface.

FIG. 5b shows the same structure of FIG. 5a but at a different $V_{GS}$ voltage. Specifically, the $V_{GS}$ voltage is set to a voltage of $\phi_{GS}/q_e$—whose corresponding energy is represented as energy span $\phi_{GS}$ 512 in FIG. 5b. Note that the applied $V_{GS}$ voltage is greater than 0 volts (because the Fermi level within the gate metal 505 of FIG. 5b is "lower" than the Fermi level within the gate metal 505 of FIG. 5a).

According to the energy band diagram of FIG. 5b, the positive $V_{GS}$ voltage is sufficiently high to "pull" the top of the well 521b below the Fermi level 511. With the top of the well being below the Fermi level 511, the electron energy states within the well 421b will be substantially occupied (i.e., the well will be substantially empty of free holes). With the well 521b substantially empty of free holes, as a basic perspective, the CNT 501 can be viewed as being in a non-conductive state (i.e., the FET is "off").

By setting the $V_{GS}$ voltage to a level that sets the Fermi level midway between the conduction band 509 and valence band 510, the CNT 501 will be in an optimally devoid state of both free electrons and free holes. Thus, applied $V_{GS}$ voltages at or near this level can be viewed as a threshold voltage that turns the FET off. In reaching the steady state of FIG. 5b, the positive gate voltage repels holes from the delta doped region 503 and CNT 501 into the n doped substrate region 500, and, attracts electrons from the n doped semiconductor region 500 into the CNT 501 and delta doped region 503. As such, the built in voltage that spans through the CNT (which is represented by barrier energy 523 of FIG. 5b) is lowered in comparison to the built-in voltage of FIG. 5a.

FIG. 5c shows an energy band diagram for a different portion of the FET than those depicted in FIGS. 5a and 5b. Specifically, whereas FIGS. 5a and 5b show energy diagrams for the device structure beneath the gate metal, FIG. 5c shows a depiction of an energy band diagram for the device structure beneath the source or drain contact regions. Thus instead of a metal/dielectric/undoped semiconductor regions leading up to the CNT 501 (as observed in FIGS. 5a and 5b), FIG. 5c shows a source or drain electrode metal region 506/507 and a degeneratively doped (p+) semiconductor region 512 leading up the CNT 501.

With the p+ semiconductor region 412 being in contact with the CNT 401, the valence band 509 at the p+/CNT interface is effectively pinned at or near the Fermi level 511. As such, the top of the well is positioned above the Fermi level 511 causing the CNT to be populated with holes beneath the source/drain regions. Depending on the applied $V_{DS}$ voltage, but at least over a range of reasonable $V_{DS}$ voltages, the top of the energy well is apt to be above the Fermi level 511 even if the FET is "off".

Figure 5D:
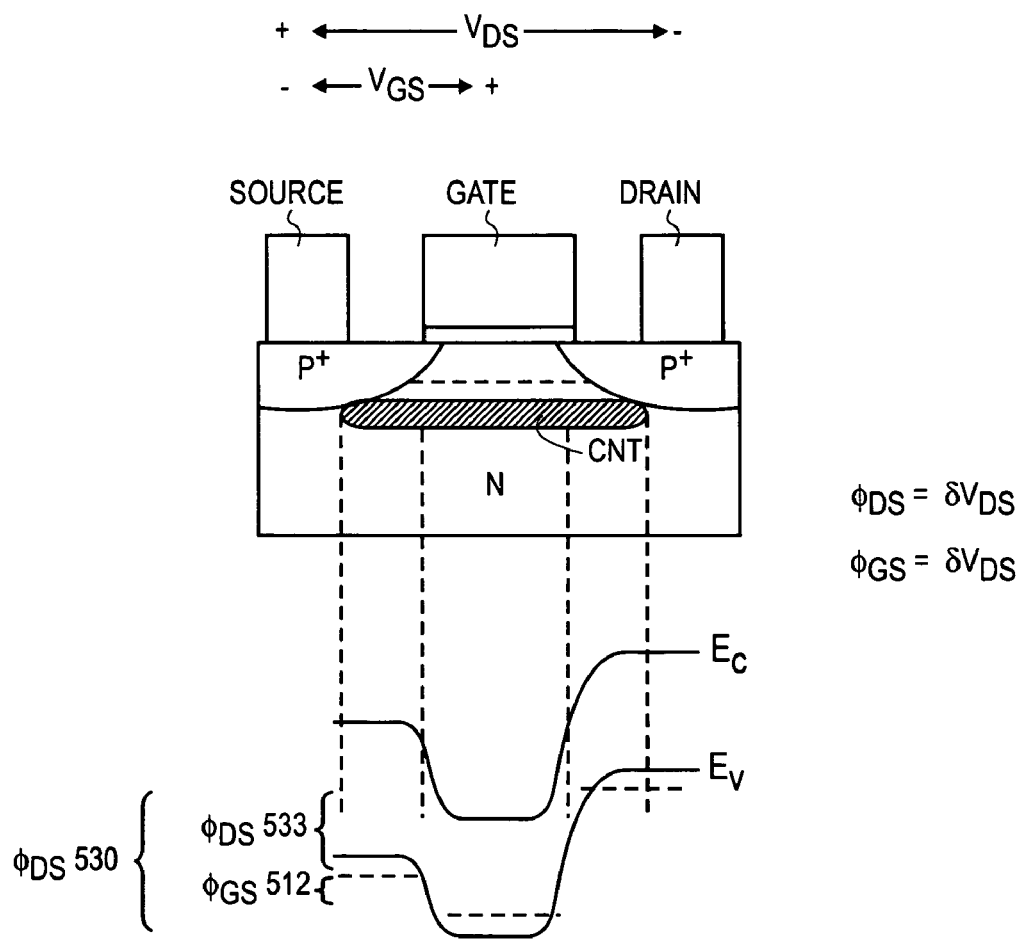

However, as depicted in FIG. 5d, the condition of having free carriers in the CNT 501 even though the FET is "off" does not lead to the flow electrical current because of the existence of energy barriers 531, 532. The energy diagram of FIG. 5c shows the conduction and valence band bending that occurs over the length of the CNT when the FET is "off". Here, as described above with respect to FIG. 5b, the top of the well (more specifically, the CNT valence band) falls below the Fermi level for the CNT regions beneath the gate (i.e., approximately over region 550 of FIG. 5d); and, as described above with respect to FIG. 5c, the top of the well rises above the Fermi level beneath the source and drain region (approximately over regions 551 and 552 of FIG. 5d).

The existence of the energy band conditions in the regions described just above creates energy barriers 531 and 532 which act to prevent the flow of holes from the CNT's source or drain regions into the region of the CNT that resides beneath the gate. As such, current flow is practically non-existent within the CNT even though it contains free holes at its source and drain regions. Here, energy differences $\phi_{GS}$ 533 and $\phi_{DS}$ 534 correspond to the applied $V_{GS}$ and $V_{DS}$ voltages respectively. Note that the $V_{GS}$ voltage is positive and the $V_{DS}$ voltage is negative.

Enhancement Mode N Type CNEW FET

FIGS. 6a and 6b show energy band diagrams for enhancement mode n type CNEW FET "off" and "on" states, respectively. FIG. 6a is directly comparable to FIG. 4a, and, FIG. 6b is directly comparable to FIG. 4b. Comparing FIG. 6a with FIG. 4a, at a high level, note that $V_{GS} \approx 0$ in both figures; yet, the bottom of the energy well is below the Fermi level in FIG. 4a but above the Fermi level in FIG. 6a. As such, unlike the FET of FIG. 4a, with $V_{GS} \approx 0$, the FET of FIG. 6a is "off".

The difference in the positioning of the bottom of the energy well with respect to the Fermi level as between the transistor design of FIG. 4a and the transistor design of FIG. 6a is a direct consequence of the difference in the height of the work function of the gate metal. Specifically, the gate metal work function height 626 of FIG. 6a is higher than the gate metal work function height 426 of FIG. 4a. A higher metal gate work function effectively corresponds to "additional lift" imparted upon the conduction 609 and valence 610 bands within the semiconductor 600, 602, 603 and CNT 601 layers. With metals whose work function is "high enough", the bottom of the well can be effectively pulled above the Fermi level, as depicted in FIG. 6a, so as to place the FET in an "off" state when $V_{GS} \approx 0$.

According to one perspective, in order to achieve a depletion mode n type device (as in FIG. 4a) with Silicon (Si) semiconductor layering 400, 402, 403 having an electron affinity of 4.05 eV, a dielectric layer 608 made from any of $HfO_2$, $ZrO_2$, $TiO_2$, HfTiO, HfAlO, $La_2O_3$ and LaAlO having a thickness within a range of 20 Angstroms to 100 Angstroms inclusive, suitable gate metal 405 materials may include those having a work function within a range of 4.0 to 4.3 eV inclusive such as: Ti, Al, TiAl and Hf. According to another perspective, in order to achieve an enhancement mode device (as in FIG. 6a) with the same FET characteristics described just above suitable gate metal 605 materials may by contrast include those having a work function within a range of 4.5 to 4.7 eV inclusive such as: W, WN, $WSi_2$, $CoSi_2$ and TiN. The above described implementations may be designed with a semi-conducting, single-walled CNT having a diameter of 1.5 to 2.0 nm inclusive, a separation of 2.0 to 5.0 nm inclusive between the CNT and the delta doped region, and, a separation of 10.0–20.0 nm inclusive between the delta doped region and the dielectric layer.

The enhancement mode FET can be made to have contact regions whose energy band diagrams are substantially similar to those of FIG. 4c. As such, in the "off" state, the enhancement mode FET will also exhibit energy barriers that practically eliminate current flow as depicted in FIG. 4d (with the exception that the applied $V_{GS}$ voltage can be approximately 0 volts rather than less than 0 volts).

FIG. 6b shows application of a positive $V_{GS}$ voltage to the FET of FIG. 6a. The application of a positive $V_{GS}$ voltage corresponds to energy difference $\phi_{GS}$ 612, which causes a lowering of the conduction 609 and valence 610 bands. At the application of a "threshold" $V_{GS}$ voltage, the bottom of the well approximately crosses from above the Fermi level to below the Fermi level, which, effectively corresponds to the turning of the FET from off to on. At voltages greater than the threshold $V_{GS}$ voltage, the bottom of the energy well will drop further below the Fermi level which corresponds to increasing the conductivity of the CNT 601.

Enhancement Mode P Type CNEW FET

FIGS. 7a and 7b show energy band diagrams for enhancement mode p type CNEW FET "off" and "on" states, respectively. FIG. 7a is directly comparable to FIG. 5a, and, FIG. 7b is directly comparable to FIG. 5b. Comparing FIG. 7a with FIG. 5a, at a high level, note that $V_{GS} \approx 0$ in both figures; yet, the top of the energy well is above the Fermi level in FIG. 5a but below the Fermi level in FIG. 7a. As such, unlike the FET of FIG. 5a, with $V_{GS} \approx 0$, the FET of FIG. 7a is "off".

The difference in the positioning of the top of the energy well with respect to the Fermi level as between the transistor design of FIG. 5a and the transistor design of FIG. 6a is a direct consequence of the difference in the height of the work function of the gate metal. Specifically, the gate metal work function height 726 of FIG. 7a is lower than the gate metal work function height 526 of FIG. 5a. A lower metal gate work function effectively corresponds to "additional drag" imparted upon the conduction 709 and valence 710 bands within the semiconductor 700, 702, 703 and CNT 701 layers. With metals whose work function is "low enough", the top of the well can be effectively pulled beneath the Fermi level, as depicted in FIG. 7a, so as to place the FET in an "off" state when $V_{GS} \approx 0$.

According to one perspective, in order to achieve a p type depletion mode device (as in FIG. 5a) with Silicon (Si) semiconductor layering 500, 502, 503 having an electron affinity of 4.05 eV, a dielectric layer 608 made from any of the aforementioned Hi-K dielectric materials, suitable gate metal 505 materials may include those having a work function within a range of 4.8–5.1 eV inclusive such as Pt, Mo, Ru, TiN, TaN and TaSiN. According to another perspective, in order to achieve a p type enhacement mode device (as in FIG. 7a) with the same FET characteristics described just above suitable gate metal 705 materials may by contrast include those having a work function within a range of 4.5–4.7 eV inclusive such as W, WN, WSi$_2$, CoSi$_2$ and TiN. The above described implementations may be designed with a semi-conducting, single-walled CNT having a diameter of 1.5 to 2.0 nm inclusive, a separation of 2.0 to 5.0 nm inclusive between the CNT and the delta doped region, and, a separation of 15.0–20.0 nm inclusive between the delta doped region and the dielectric layer.

The enhancement mode p type FET can be made to have contact regions whose energy band diagrams are substantially similar to those of FIG. 5c. As such, in the "off" state, the enhancement mode p type FET will also exhibit energy barriers that practically eliminate current flow as depicted in FIG. 5d (with the exception that the applied $V_{GS}$ voltage can be approximately 0 volts rather than greater than 0 volts).

FIG. 7b shows application of a negative $V_{GS}$ voltage to the FET of FIG. 6a. The application of a negative $V_{GS}$ voltage corresponds to energy difference $\phi_{GS}$ 712, which causes a raising of the conduction 709 and valence 710 bands. At the application of a "threshold" $V_{GS}$ voltage, the top of the well approximately crosses from below the Fermi level to above the Fermi level, which, effectively corresponds to the turning of the FET from off to on. At voltages more negative than the threshold $V_{GS}$ voltage, the top of the energy well will rise further above the Fermi level which corresponds to increasing the conductivity of the CNT 701.

Exemplary Manufacturing Process Embodiment

Figure 8A:
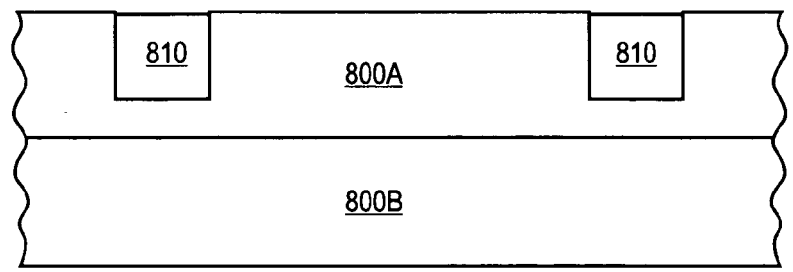
FIGS. 8a through 8e show a method for manufacturing a CNEW FET.

FIGS. 8a through 8e show an exemplary manufacturing process for forming a CNEW FET. Referring initially to FIG. 8a, a semiconductor layer 800a is epitaxially grown upon a semiconductor substrate layer 800b. In the case of an n type device, both of layers 800a, 800b are doped p type; while, in the case of a p type device, both of layers 800a, 800b are doped n type. Shallow trench isolation (STI) features are then built into top layer 800a.

Figure 8B:
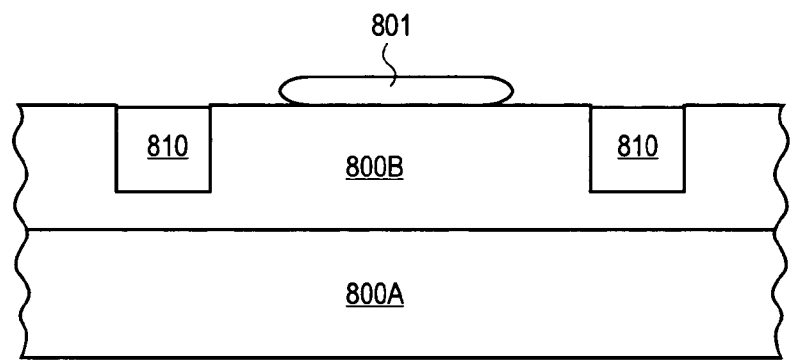
Figure 8C:
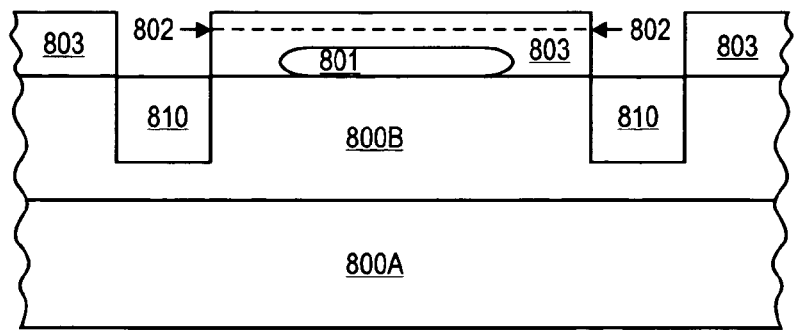

Referring to FIG. 8b, a single walled, semi-conducting CNT 801 is placed on layer 800a. According to one possible technique, an organic solvent containing suspended CNTs is spun coated onto the surface of layer 800a in order to apply the CNT 801. Referring to FIG. 8c, an intrinsic layer 803 of Silicon is epitaxially grown on layer 800a (e.g., along the (100) axis). According to one implementation, the epitaxy is perfomed using ultra-high vacuum chemical vapor deposition (UHVCD) using Silane (SiH$_4$) and Hydrogen Chloride (HCl) for selectivity. The delta doped layer 802 is then formed in intrinsic layer 803 (e.g., by ion implant).

Figure 8D:
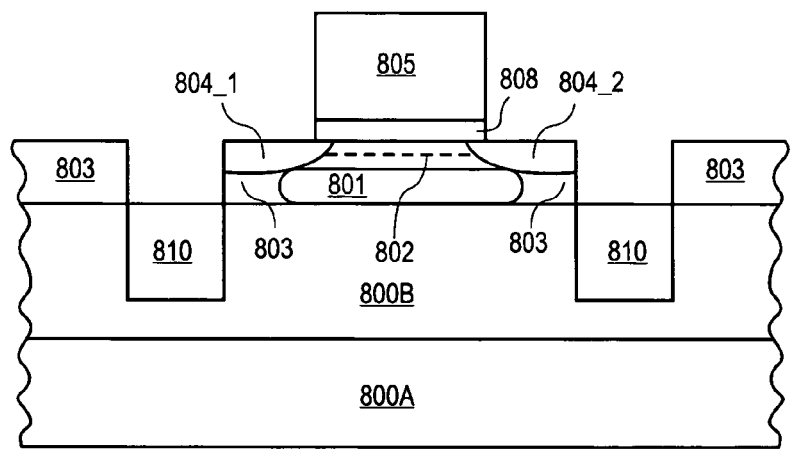

Referring to FIG. 8d, a Hi-K dielectric layer 808 is formed on the intrinsic layer (e.g., by way of Atomic Layer Deposition (ALD)) and the metal gate 805 is formed on the dielectric 808 by way of a physical vapor deposition (PVD) process such as DC magnetron sputtering. The source/drain degeneratively doped regions 804_1, 804_2 are then formed using the STI regions 810 and the metal gate 805 for self-alignment.

Figure 8E:
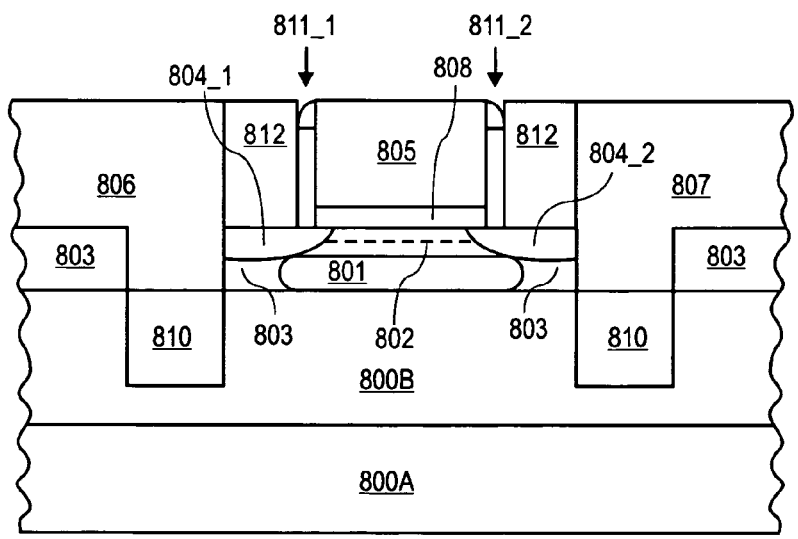

Referring to FIG. 8e, silicon nitride (Si$_3$N$_4$) spacers 811_1, 811_2 are formed (e.g., with a Chemical Vapor Deposition (CVD) process followed by anisotropic dry etching). An electrically non-conductive layer 812 (e.g., made of fluorinated silicon dioxide (SiOF) or Benzocyclobutene (BCB) or poly-imide) is then formed which is etched (e.g., by contact lithography) to etch trenches for the metal source and drain electrodes. The source and drain electrodes 806, 807 are then formed (e.g., by a Tungsten (W) CVD process followed by a dry etch).

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

The invention claimed is:

1. A transistor comprising a Carbon nanotube channel between a doped semiconductor region and an undoped semiconductor region, said undoped semiconductor region between said Carbon nanotube and a delta doped region that is doped opposite that of said doped semiconductor region.

2. The transistor of claim 1 wherein said delta doped region is doped p type.

3. The transistor of claim 2 further comprising a p+ doped semiconductor region that makes contact to said Carbon nanotube, said p+ doped semiconductor region in contact with a source electrode comprised of metal.

4. The transistor of claim 2 further comprising a p+ doped semiconductor region that makes contact to said Carbon nanotube, said p+ doped semiconductor region in contact with a drain electrode comprised of metal.

5. The transistor of claim 2 wherein said transistor has a gate comprised of a metal having a work function within a range of 4.5 to 4.7 eV inclusive.

6. The transistor of claim 5 wherein said metal comprises material selected from the group consisting of:
W,
WN,
WSi$_2$,
CoSi$_2$; and,
TiN.

7. The transistor of claim 1 wherein said delta doped region is doped n type.

8. The transistor of claim 7 further comprising a n+ doped semiconductor region that makes contact to said Carbon nanotube, said n+ doped semiconductor region in contact with a source electrode comprised of metal.

9. The transistor of claim 7 further comprising a n+ doped semiconductor region that makes contact to said Carbon nanotube, said n+ doped semiconductor region in contact with a drain electrode comprised of metal.

10. The transistor of claim 7 wherein said transistor has a gate comprised of a metal having a work function within a range of 4.5 to 4.7 eV inclusive.

11. The transistor of claim 10 wherein said metal comprises a material selected from the group consisting of:
W;
WN;
WSi$_2$;
CoSi$_2$; and,
TiN.

12. A structure to form an energy well within a Carbon nanotube, comprising:
  a) a doped semiconductor region;
  b) an undoped semiconductor region, said Carbon nanotube between said doped semiconductor region and said undoped semiconductor region; and,
  c) a delta doped semiconductor region, said undoped semiconductor region between said Carbon nanotube and said delta doped region, said delta doped semiconductor region doped opposite that of said doped semiconductor region.

13. The structure of claim 12 further comprising a second undoped semiconductor region, said delta doped region between said undoped semiconductor region and said second undoped semiconductor region.

14. The structure of claim 13 further comprising a metal region, said second undoped semiconductor region between said metal region and said delta doped semiconductor region.

15. The structure of claim 14 where said metal region has a work function within a range of 4.5 to 4.7 eV inclusive.

* * * * *